United States Patent
Sekiya et al.

(10) Patent No.: US 11,796,608 B2
(45) Date of Patent: Oct. 24, 2023

(54) MAGNETIC PROPERTY MEASUREMENT APPARATUS

(71) Applicant: Samsung Electronics Co., Ltd., Suwon-si (KR)

(72) Inventors: Harutaka Sekiya, Yokohama (JP); Shinji Ueyama, Kawasaki (JP); Tomoki Onishi, Yokohama (JP)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 137 days.

(21) Appl. No.: 17/467,967

(22) Filed: Sep. 7, 2021

(65) Prior Publication Data

US 2022/0137160 A1    May 5, 2022

(30) Foreign Application Priority Data

Oct. 30, 2020   (JP) ................................. 2020-182126
Feb. 3, 2021    (KR) ......................... 10-2021-0015659

(51) Int. Cl.
*G01R 33/07*     (2006.01)
*G01R 33/032*    (2006.01)
*G01R 33/00*     (2006.01)

(52) U.S. Cl.
CPC ....... *G01R 33/0325* (2013.01); *G01R 33/007* (2013.01); *G01R 33/0017* (2013.01)

(58) Field of Classification Search
CPC ................ G01R 33/00; G01R 33/0035; G01R 33/0023; G01R 33/0017; G01R 31/3191;
(Continued)

(56) References Cited

U.S. PATENT DOCUMENTS 7,187,166 B2    3/2007   Sugano
2003/0200798 A1*  10/2003  Lindig ................... G01Q 60/38
                                                          73/105

(Continued)

FOREIGN PATENT DOCUMENTS

JP    2004-301548 A    10/2004
JP    2013-038348 A     2/2013
(Continued)

*Primary Examiner* — Jermele M Hollington
*Assistant Examiner* — Taqi R Nasir
(74) *Attorney, Agent, or Firm* — HARNESS. DICKEY & PIERCE, P.L.C.

(57) ABSTRACT

The inventive concepts provide a magnetic property measurement apparatus capable of quickly measuring a magnetic property of a subject without a decrease in a measurement speed that might occur due to an electromagnet. In addition, the inventive concepts provide a magnetic property measurement apparatus capable of monitoring a magnetization distribution of a memory device as an image and integrating images by using a TDI camera, thereby being capable of performing highly sensitive measurement and not having to capture images for a long time. The magnetic property measurement apparatus includes: a magnetic field generation unit configured to generate a magnetic field which is constant with time and varies with relative position; a mobile unit configured to move a subject to be measured in the magnetic field; and a measurement unit configured to measure a magnetic property of the subject moving in the magnetic field.

20 Claims, 9 Drawing Sheets

(58) Field of Classification Search
CPC .. G01R 33/0325; G01R 33/007; G01B 7/004; G01C 17/38; G06F 3/017; G06F 3/0346; G06F 3/012
See application file for complete search history.

(56) References Cited

U.S. PATENT DOCUMENTS

| | | | | |
|---|---|---|---|---|
| 2004/0201378 | A1* | 10/2004 | Sugano | B82Y 35/00 |
| | | | | 324/226 |
| 2020/0088683 | A1 | 3/2020 | Kawano | |
| 2020/0126873 | A1* | 4/2020 | Noh | H10B 61/22 |

FOREIGN PATENT DOCUMENTS

| | | |
|---|---|---|
| JP | 2017-130611 A | 7/2017 |
| JP | 2018-096936 A | 6/2018 |

* cited by examiner

MAGNETIC PROPERTY MEASUREMENT APPARATUS

CROSS-REFERENCE TO RELATED APPLICATIONS

This application is based on and claims priority under 35 U.S.C. § 119 to Japanese Patent application No. 2020-182126, filed on Oct. 30, 2020, in the Japan Patent Office, and Korean Patent Application No. 10-2021-0015659, filed on Feb. 3, 2021, in the Korean Intellectual Property Office, the disclosures of each of which are incorporated by reference herein in their entirety.

BACKGROUND

The inventive concepts relate to a magnetic property measurement apparatus, and more particularly, to an apparatus for measuring the magnetic property of a semiconductor device including a magnetic film.

In the case of recently produced nonvolatile memory devices (e.g., a magnetic random access memory (MRAM) device) information is recorded by magnetism. Therefore, since such nonvolatile memory devices, on which information is to be recorded, are required to have a magnetic property, it is beneficial to measure and manage any deviations in the magnetic properties. For example, to measure a magnetic property, a method of changing an external magnetic field and searching for a magnetic field in which magnetization reversal occurs, while monitoring magnetization of a memory device by using a magneto-optic effect (e.g., a magneto-optical Kerr effect (MOKE)) microscope or the like, may be used.

SUMMARY

The inventive concepts provide a magnetic property measurement apparatus capable of minimizing a measurement time by precisely and quickly measuring a magnetic property of a memory device.

According to some embodiments of the inventive concepts, there is provided a magnetic property measurement apparatus including: a magnetic field generation unit configured to generate a magnetic field which is constant with time and varies with relative position; a mobile unit configured to move a subject to be measured in the magnetic field; and a measurement unit configured to measure a magnetic property of the subject moving in the magnetic field.

According to some embodiments of the inventive concepts, there is provided a magnetic property measurement apparatus including: a mobile unit configured to move a subject in a magnetic field; a magnetic field generation unit spaced upward from an upper surface of the subject, and configured to generate the magnetic field which is constant with time and varies with relative position; a Kerr rotation angle detection optical system configured to irradiate polarized first light on the subject, and to separate a polarization component of reflective light reflected from the subject; and a time delay integration (TDI) camera configured to pick up polarization of the reflective light by being synchronizing with the movement of the subject, and detect a magnetic property of the subject as an image.

According to some embodiments of the inventive concepts, there is provided a magnetic property measurement apparatus including: a mobile unit on which a subject is disposed thereon and which is configured to move the a subject on a surface plate in a magnetic field; a magnetic field generation unit disposed to be spaced upward from an upper surface of the subject, and configured to generate a magnetic field which is constant with time and varies with relative position by using two electromagnets or two permanent magnets; a Kerr rotation angle detection optical system configured to irradiate polarized first laser light on the subject and to separate a polarization component of reflective light reflected from the subject; and a time delay integration (TDI) camera configured to pick up polarization of the reflective light by synchronizing with a movement of the mobile unit, and to detect a magnetic property of the subject as an image, wherein a first magnet from among the two electromagnets or the two permanent magnets generates a positive (+) magnetic field oriented from the subject to the first magnet, a second magnet from among the two electromagnets or the two permanent magnets generates a negative (−) magnetic field oriented from the second magnet, and the magnetic property of the subject is measured by, according to the movement of the mobile unit, starting from the positive (+) magnetic field, passing through a zero magnetic field, and ending in the negative (−) magnetic field.

The magnetic property measurement apparatus may quickly measure the magnetic property of the subject without a decrease in a measurement speed that might occur due to an electromagnet.

The magnetic property measurement apparatus may include: a laser unit configured to irradiate laser light on the subject; and an image detection unit configured to pick up polarization of reflective light of the subject by being synchronized with the movement and detect a magnetic property as an image.

The magnetic property measurement apparatus may simultaneously measure a plurality of parts of the subject.

The magnetic property measurement apparatus may further include a temperature rising optical system configured to raise a temperature of the subject by irradiating laser light on the subject.

The magnetic property measurement apparatus may measure a magnetic property followed by a temperature change.

In the magnetic property measurement apparatus, the temperature rising optical system may be further configured to irradiate light on a portion of the subject.

The magnetic property measurement apparatus may raise a temperature of only a portion of the subject, which is needed for the magnetic property.

The magnetic property measurement apparatus may include a rocking mirror configured to deflect a luminous flux of light, wherein the rocking mirror is further configured to synchronize a deflecting direction with stage movement.

In the magnetic property measurement apparatus, the temperature rising optical system may keep raising a temperature of the same point on a wafer even though a stage moves.

In the magnetic property measurement apparatus, the temperature rising optical system may previously calibrate light intensity of light with respect to a temperature and maintain a temperature of the subject to be substantially constant.

The magnetic property measurement apparatus may measure a magnetic property of the subject at a certain temperature.

The magnetic property measurement apparatus may previously calibrate calibration values of laser light with respect to a plurality of temperatures and raise a temperature to a plurality of temperatures.

The magnetic property measurement apparatus may measure a magnetic property of the subject at the plurality of temperatures.

In the magnetic property measurement apparatus, the subject may be a semiconductor.

The magnetic property measurement apparatus may measure a magnetic property of the semiconductor and inspect quality of the semiconductor.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
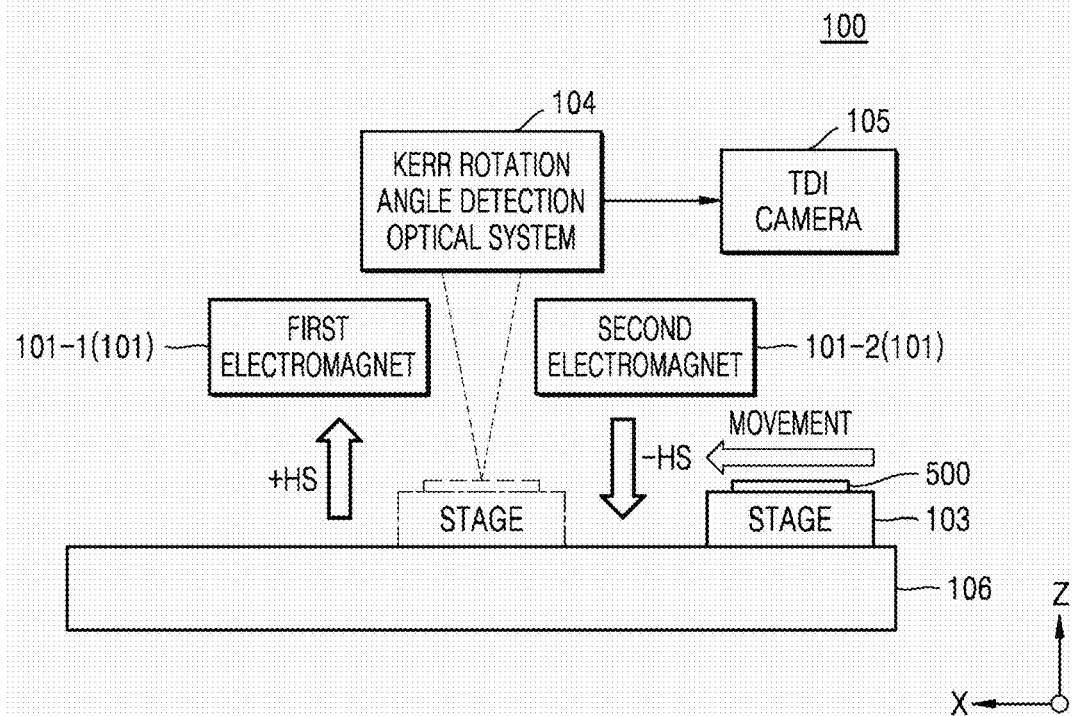
FIG. 1 is a conceptual diagram of a magnetic property measurement apparatus according to some embodiments.

Hereinafter, some example embodiments of the inventive concepts will be described in detail with reference to the accompanying drawings. Like reference numerals in the drawings denote like elements, and thus their repetitive description will be omitted.

When the terms "about" or "substantially" are used in this specification in connection with a numerical value, it is intended that the associated numerical value includes an operational tolerance (e.g., ±10%) around the value.

Figure 2:
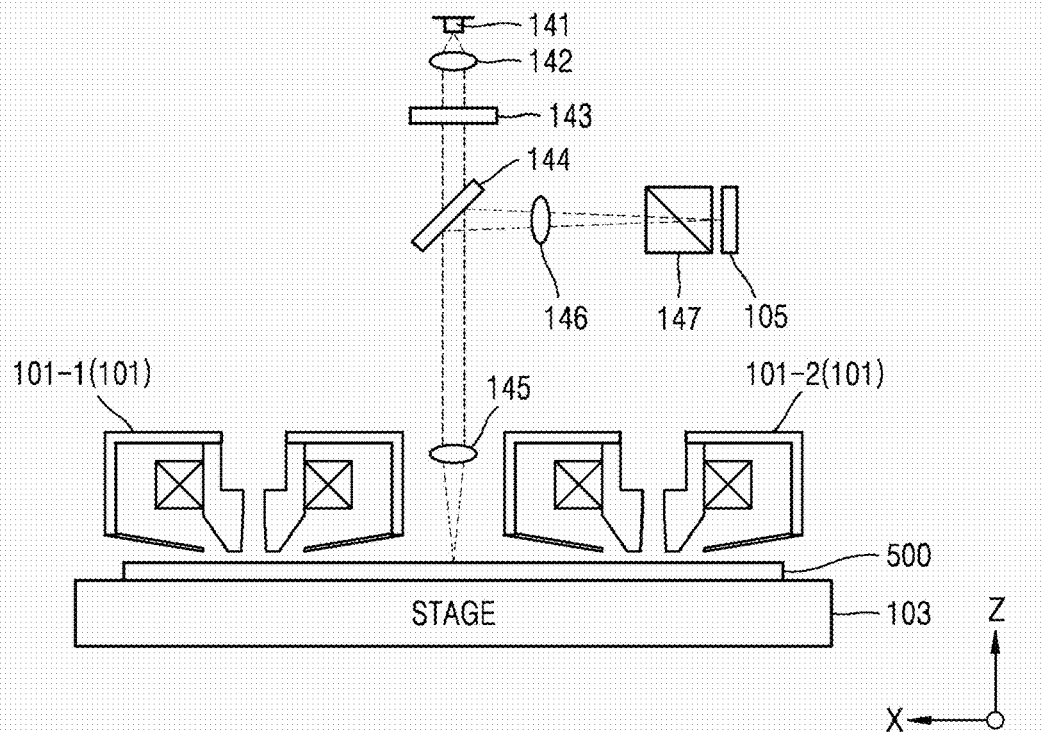
FIG. 2 is a conceptual diagram of a Kerr rotation angle detection optical system in the magnetic property measurement apparatus of FIG. 1.

FIG. 1 is a conceptual diagram of a magnetic property measurement apparatus 100 according to some embodiments, and FIG. 2 is a conceptual diagram of a Kerr rotation angle detection optical system 104 in the magnetic property measurement apparatus 100 of FIG. 1.

Referring to FIGS. 1 and 2, the magnetic property measurement apparatus 100 according to some examples of the present embodiments may include a magnetic field generation unit 101, a stage 103, the Kerr rotation angle detection optical system 104, a time delay integration (TDI) camera 105, and a surface plate 106.

The magnetic field generation unit 101 may generate a magnetic field which is constant with time and varies with position. The magnetic field generation unit 101 may include a first electromagnet 101-1 and a second electromagnet 101-2. For example, each of the first electromagnet 101-1 and the second electromagnet 101-2 may include a coil, and a magnetic field, which is constant with time, may be generated by applying a constant voltage and current to the coil.

The first electromagnet 101-1 and/or the second electromagnet 101-2 may have fixed locations. For example, the first electromagnet 101-1 and the second electromagnet 101-2 may be fixed in locations spaced at a certain distance from a space in which the stage 103 moves. For example, the first electromagnet 101-1 and the second electromagnet 101-2 may be fixed to locations spaced at a certain distance in a third direction (e.g., a Z-direction) from an upper surface of the surface plate 106 on which the stage 103 is disposed.

The first electromagnet 101-1 and the second electromagnet 101-2 may be separated from each other, and the space between the first electromagnet 101-1 and the second electromagnet 101-2 may be where the Kerr rotation angle detection optical system 104 may measure a subject 500. For example, the first electromagnet 101-1 and the second electromagnet 101-2 may be disposed to be separated from each other in a first direction (e.g., an X-direction), and the Kerr rotation angle detection optical system 104 may measure the subject 500 through the space between the first electromagnet 101-1 and the second electromagnet 101-2.

The first electromagnet 101-1 and the second electromagnet 101-2 may generate constant magnetic fields in opposite directions, respectively. For example, as shown in FIG. 1, the first electromagnet 101-1 may generate a magnetic field (+)HS in an upper direction (e.g., a positive Z-axis direction) of the third direction (e.g., the Z-direction). In addition, the second electromagnet 101-2 may generate a magnetic field (−)HS in a lower direction (e.g., a negative Z-axis direction) of the third direction (the Z-direction). However, the examples are not so limited, and, according to some embodiments, the first electromagnet 101-1 and the second electromagnet 101-2 may generate magnetic fields in opposite directions to those described above, respectively.

For example, the first electromagnet 101-1 may generate the magnetic field (−)HS in the lower direction (the negative Z-axis direction) of the third direction (the Z-direction), and the second electromagnet 101-2 may generate the magnetic field (+)HS in the upper direction (the positive Z-axis direction) of the third direction (the Z-direction). By this combination of the first electromagnet 101-1 and the second electromagnet 101-2, the magnetic field generation unit 101 may generate a magnetic field which is constant with time and varies with position.

The stage 103 may correspond to a mobile unit configured to move the subject 500 to be measured in a magnetic field (e.g., the magnetic field generated by the magnetic field generation unit 101). For example, the subject 500 (e.g., a wafer) may be disposed on an upper surface of the stage 103, and the wafer may be moved by the movement of the stage

103. As shown by an arrow of 'movement' in FIG. 1, the stage 103 may move from a side of the second electromagnet 101-2 toward a side of the first electromagnet 101-1 by passing through a measurement location of the Kerr rotation angle detection optical system 104, and accordingly, the wafer may move in the same direction. In some embodiments, the mobile unit may be configured to move using an actuator (e.g., a pneumatic and/or hydraulic rail, and/or a motor) included in and/or connected to the stage 103.

The Kerr rotation angle detection optical system 104 may be configured to measure a magnetic property (e.g., a magneto-optic property) of the subject 500 moving in the magnetic field. For example, the Kerr rotation angle detection optical system 104 may measure the magnetic property of the subject 500, by irradiating light on the subject 500 and measuring polarization and/or intensity of reflected light. The Kerr rotation angle detection optical system 104 may be and/or correspond to a portion of a measurement unit. For example, the measurement unit may include the Kerr rotation angle detection optical system 104 and the TDI camera 105. In some embodiments, the Kerr rotation angle detection optical system 104 may include a magneto-optical Kerr effect (MOKE) microscope. For example, the Kerr rotation angle detection optical system 104 may include a light source (e.g., a detection laser unit 141), a first lens 142, a polarization element 143, a first beam splitter 144, a second lens 145, a third lens 146, and a polarization beam splitter 147.

The detection laser unit 141 may generate and emit laser light for measuring a magnetic property. For example, the detection laser unit 141 may generate and output laser light for measuring a Kerr effect. In some embodiments, the detection laser unit 141 may use various light-emitting elements, besides a laser (such as a light-emitting diode), as a light source for measuring the Kerr effect.

The first lens 142 may be a collimator lens which refracts the light (e.g., a laser) from the light source (e.g., the detection laser unit 141) to be in a parallel state. For example, the first lens 142 may refract the laser light from the detection laser unit 141 to be parallel light and to output the parallel light.

The polarization element 143 may transmit, there through, only a certain polarization component from among the parallel light. The polarization element 143 may linearly polarize incident laser light. For example, the polarization element 143 may convert incident laser light into linearly polarized laser light by passing only P-polarized light (or horizontally polarized light) or S-polarized light (or vertically polarized light). However, the present embodiments are not so limited, and, according to some embodiments, the polarization element 143 may perform circular polarization, elliptical polarization, and/or the like.

The first beam splitter 144 may transmit (e.g., through refraction, reflection, and/or conveyance through) the light from the light source (e.g., the detection laser unit 141) so that the light moves toward the subject 500. In addition, the first beam splitter 144 may transmit light reflected from the subject 500 (e.g., the light of which the polarization has been changed by the Kerr effect of the subject 500) so that the light reflected from the subject 500 moves toward the TDI camera 105. For example, the first beam splitter 144 may include a prism and/or a partially transparent mirror, but is not limited thereto.

The second lens 145 may concentrate the light from the light source (e.g., detection laser unit 141). For example, the second lens 145 may be an objective lens which concentrates laser light to the subject 500.

The third lens 146 may focus on an image pickup surface of the TDI camera 105. For example, the third lens 146 may be an imaging lens which picks up an image on the image pickup surface of the TDI camera 105 from the reflective light (e.g., the light reflected from the subject 500).

The polarization beam splitter 147 may be an optical element configured to split the incident light into S-polarized light (or vertically polarized light) and P-polarized light (or horizontally polarized light). For example, the polarization beam splitter 147 may split the reflective light, of which polarization has been changed on the subject 500 by the Kerr effect, into S-polarized light (or vertically polarized light) and P-polarized light (or horizontally polarized light). In some embodiments, the polarization beam splitter 147 may be implemented by a polarizing prism, for example, a Nomarski prism, a Wollaston prism, and/or a Rochon prism; however, the example embodiments are not limited thereto.

In addition, both the S-polarized light and the P-polarized light split by the polarization beam splitter 147 may be detected by the TDI camera 105. In some embodiments, the S-polarized light and the P-polarized light may be individually detected by the TDI camera 105, or only one thereof may be detected by the TDI camera 105. When both the S-polarized light and the P-polarized light are detected by the TDI camera 105 (e.g., in light that passed through a Nomarski prism) there may be no big problem because the S-polarized light and the P-polarized light are output at an angle at which the S-polarized light and the P-polarized light are converged, but, for example, after passing through a Wollaston prism and/or a Rochon prism, a converging mirror (not illustrated) may be used as the S-polarized light and the P-polarized light may be output at an angle at which the S-polarized light and the P-polarized light are diverged.

The principle of measuring the magnetic property of the subject 500 through Kerr rotation angle detection in the Kerr rotation angle detection optical system 104 will be described in more detail with reference to FIGS. 3 to 9.

The TDI camera 105 is an image detector configured to detect (e.g., as an image) a magnetic property of a subject moving in a magnetic field. In some embodiments, the TDI camera 105 may be a device configured to capture an image of a moving subject through an integration and exposure technique. Herein, the integration and exposure technique indicates a technique of photographing one region several times and superimposing data of the several captured images to generate one sheet of image. As such, when one sheet image is generated using data of several images, a bright and clear image may be captured even in a dark environment.

An example integration and exposure technique will be described in more detail with reference to FIGS. 10 and 11.

The surface plate 106 may indicate a device and/or surface having the stage 103 disposed on the upper surface thereof. As shown in FIG. 1, the stage 103 may move on the upper surface of the surface plate 106. In some embodiments, the upper surface of the surface plate 106 may be flat and used as a reference plane.

The magnetic property measurement apparatus 100 according to the present embodiments may measure the magnetic property of the subject 500 at a high speed without a decrease in a measurement speed that might occur due to an electromagnet. In addition, the magnetic property measurement apparatus 100 according to the present embodiments may monitor a magnetization distribution of a memory device as an image and integrate images by using the TDI camera 105, and thus, the magnetic property measurement apparatus 100 may perform highly sensitive measurement and does not have to capture images for a long time. For example, the TDI camera 105 can capture an image, including highly sensitive measurements, of the subject 500 without requiring a long exposure time.

Figure 3:
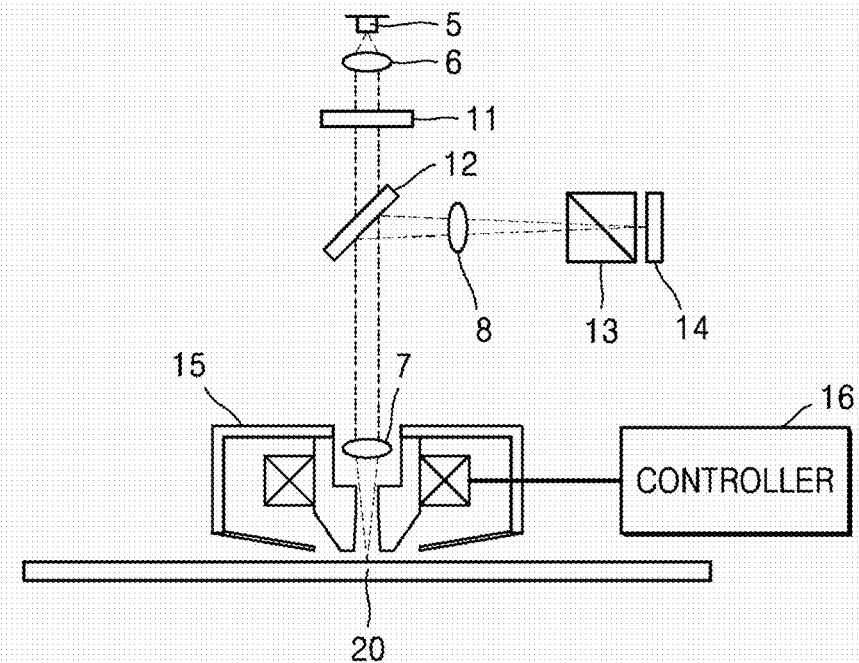
FIG. 3 is a conceptual diagram of a magnetic property measurement apparatus to describe the principle of magnetic property measurement.
Figure 4:
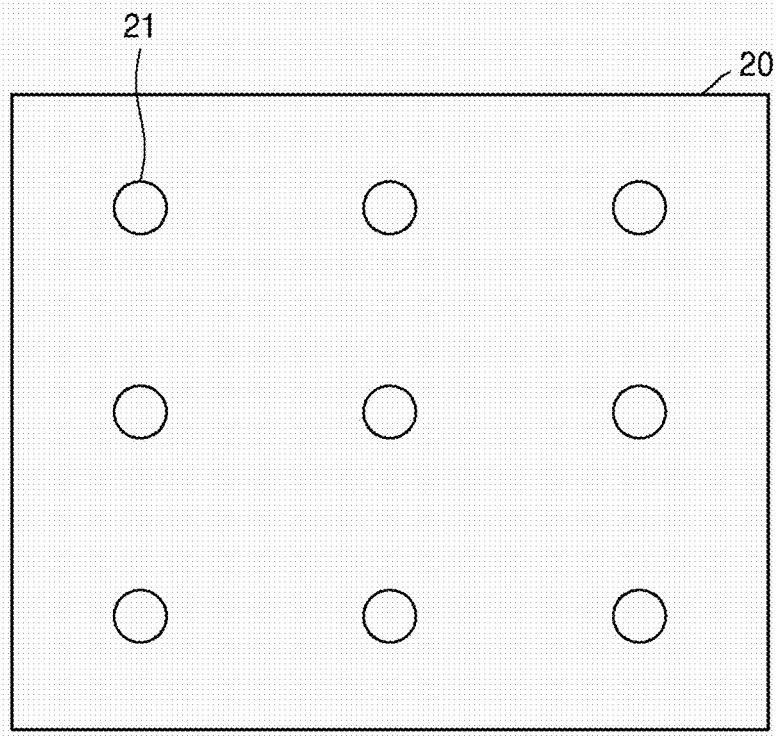
FIG. 4 is a top view of a captured image in magnetic property measurement of a memory device.
Figure 5:
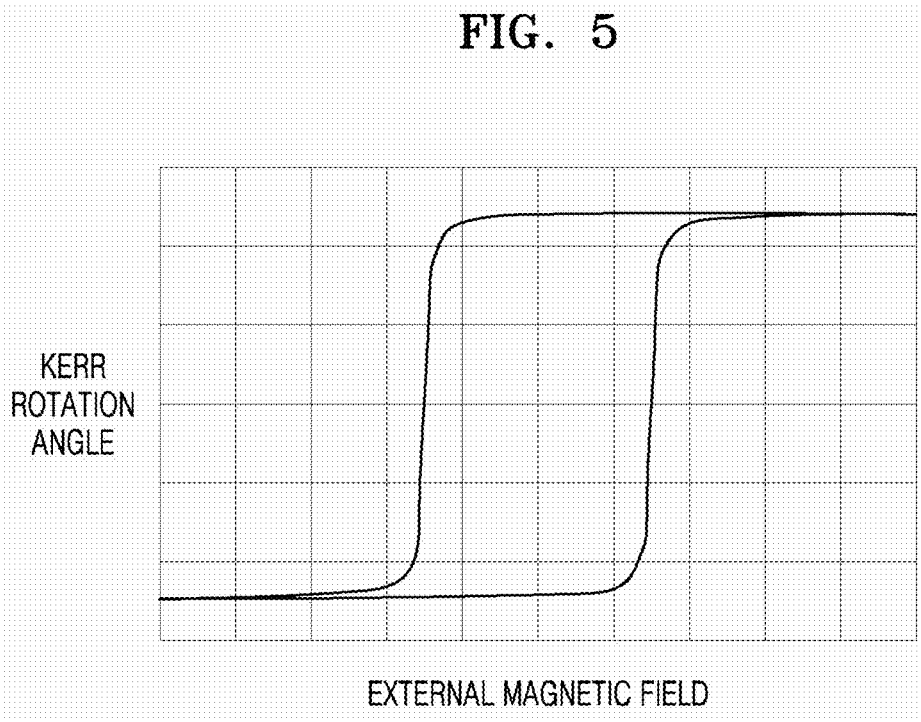
FIGS. 5 and 6 are graphs showing a relationship between an external magnetic field and a Kerr rotation angle.
Figure 6:
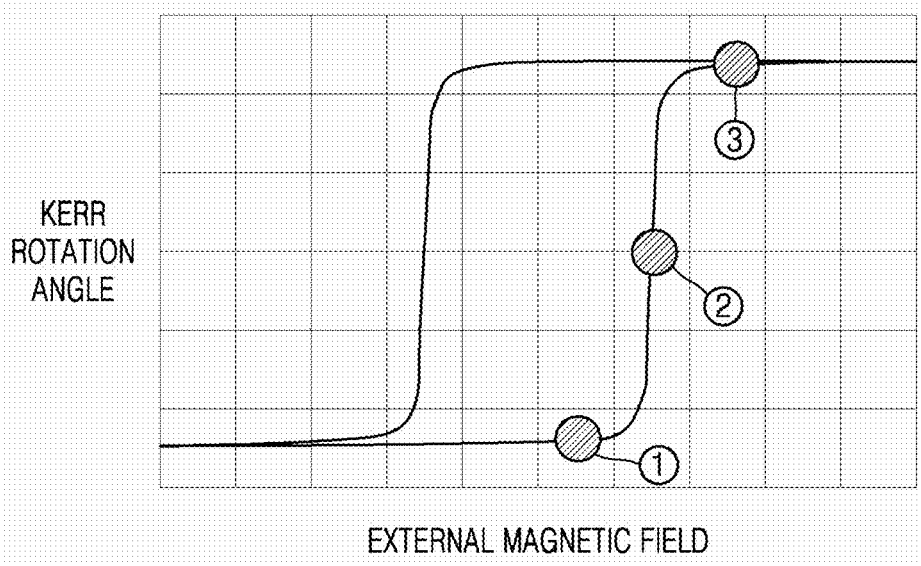
Figure 7:
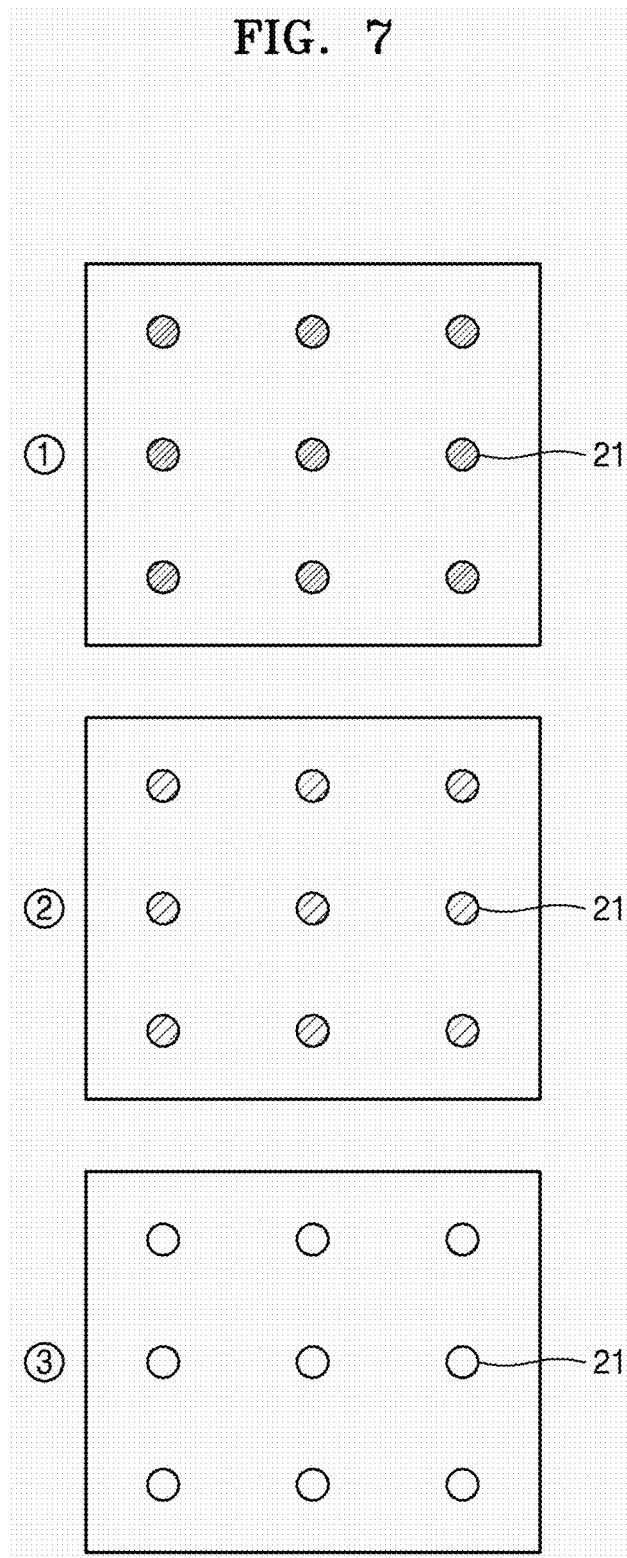
FIG. 7 is a top view of captured images in magnetic property measurement of a memory device.
Figure 8:
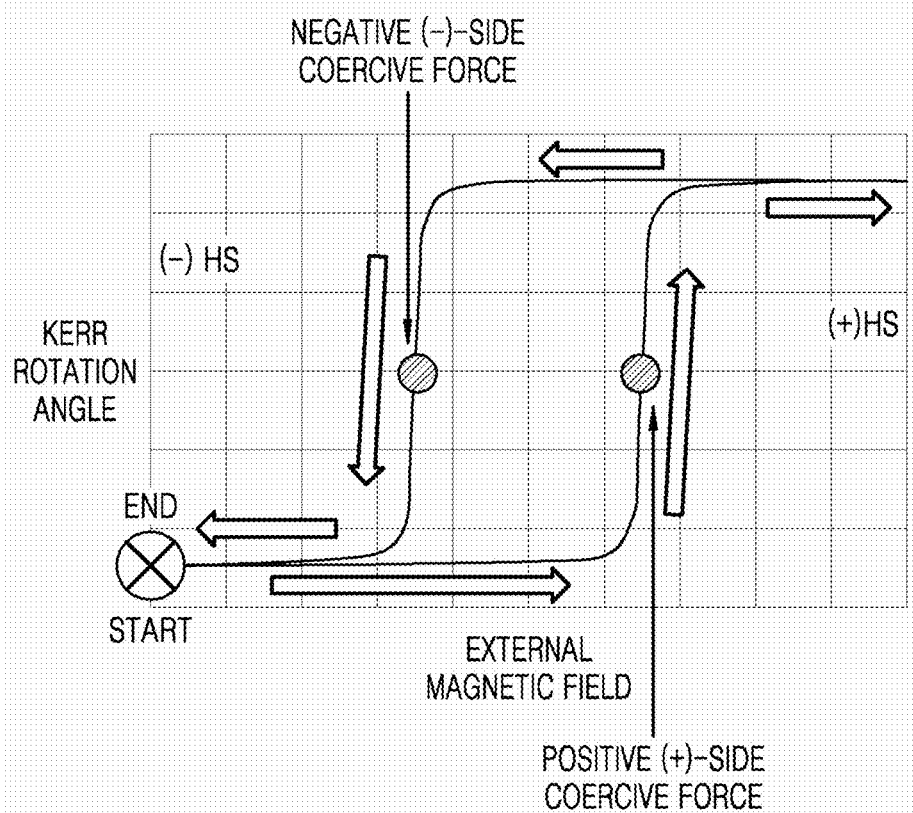
FIG. 8 is a graph showing a relationship between an external magnetic field and a Kerr rotation angle.
Figure 9:
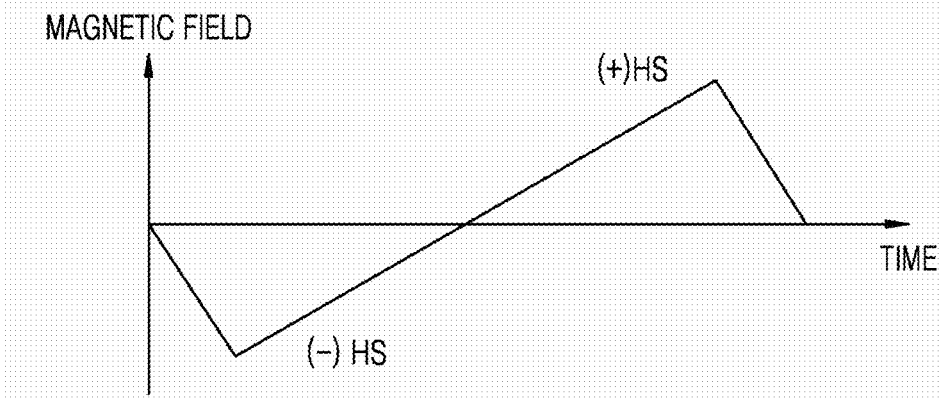
FIG. 9 is a graph showing a relationship between a time and a magnetic field change in magnetic property measurement.

FIG. 3 is a conceptual diagram of a magnetic property measurement apparatus 10 to describe the principle of magnetic property measurement; FIGS. 4 and 7 are top views of captured images in magnetic property measurement of a memory device; FIGS. 5, 6, and 8 are graphs showing a relationship between an external magnetic field and a Kerr rotation angle; and FIG. 9 is a graph showing a relationship between a time and a magnetic field change in magnetic property measurement. The description made above with reference to FIGS. 1 and 2 will be simply repeated or omitted.

Referring to FIGS. 3 to 9, the magnetic property measurement apparatus 10 may be a microscope configured to visualize magnetization of a matter by using a magneto-optical effect. For example, in FIG. 3, the comparative magnetic property measurement apparatus 10 may be a magneto-optical Kerr effect (MOKE) microscope. However, since the principle of magnetic property measurement is described using the MOKE microscope of FIG. 3 and points out problems in an existing magnetic property measurement apparatus while describing the principle of magnetic property measurement. Therefore, even in the magnetic property measurement apparatus 100 of FIG. 1, a magnetic property may be measured by using the magneto-optical effect to be described below.

The magneto-optical effect used for magnetic property measurement may be, for example, a polar Kerr effect and/or a Kerr effect. The Kerr effect indicates a phenomenon that polarization and/or intensity of reflective light (e.g., reflected from the surface of a magnetic substance) changes with respect to incident light when the light is emitted on the surface of the magnetic substance, and a polarization angle may change by a magnetization component that is orthogonal to the surface of the magnetic substance. For example, reflective light from a non-magnetized magnetic substance may have the same polarization angle as incident light, the polarization angle of the reflective light may change in a (+) direction when the magnetic substance is magnetized in the (+) direction, and the polarization angle of the reflective light may change in a (−) direction when the magnetic substance is magnetized in the (−) direction.

In the magnetic property measurement apparatus 10, an analyzer 13 (such as a polarization beam splitter) is inserted into an optical path of the reflective light, and the reflective light having transmitted through the analyzer 13 may have light intensity changing according to a polarization angle. Therefore, a polarization angle change according to the Kerr effect and a light intensity change according to a changed polarization angle may be picked up by a camera 14 to visualize magnetization of a magnetic substance. Eventually, a magnetic property of a magnetic substance may be visualized by changing a magnetic field to be applied to the magnetic substance while monitoring magnetization of the magnetic substance by using the magnetic property measurement apparatus 10. A magnetic field may be changed by a controller 16 configured to control a location and a direction of a magnet 15, and the magnet 15 may be, for example, an electromagnet or a permanent magnet. For example, a controller 16, including processing circuitry such as hardware including logic circuits; a hardware/software combination such as a processor executing software; or a combination thereof, may control the direction and/or intensity of the magnet 15.

The magnetic property measurement apparatus 10 may include a laser unit 5, first to third lenses 6, 7, and 8, a polarization element 11, a beam splitter 12, the analyzer 13, the camera 14, the magnet 15, and the controller 16. In the magnetic property measurement apparatus 10, laser light emitted from the laser unit 5 may become linearly polarized light (such as P-polarized light or S-polarized light) through the polarization element 11. The linearly polarized light may be irradiated on a subject (e.g., a wafer 20) by transmitting through or being reflected from the beam splitter 12. Reflective light from the wafer 20 may be reflected from or transmit through the beam splitter 12 and then be incident to the camera 14 through the analyzer 13. Herein, the first lens 6 may be, for example, a collimator lens, the second lens 7 may be, for example, an objective lens, and the third lens 8 may be, for example, an imaging lens. In addition, the analyzer 13 is a polarization beam splitter and may split incident light into P-polarized light and S-polarized light.

As described above, because the intensity of light incident to the camera by the analyzer 13 changes according to a polarization angle, a magnetization distribution of the wafer 20 may be visualized. In addition, by sweeping a magnetic field, a magnetic property of the wafer 20 may be measured from a polarization angle distribution according to the magnetic field. For example, in the follow description, the memory devices 21 are disposed on the wafer 20 in rows and columns (as shown in FIG. 4), and a magnetic property of each memory device 21 is as shown in FIG. 5. However, the example embodiments are not limited thereto, and although FIG. 4 shows that shapes of the memory devices 21 are simply small circles, the shapes and intervals of the memory devices 21 may be different from those shown in FIG. 4. In addition, for convenience of description, FIG. 4 shows that a shape of the wafer 20 is a quadrangle.

When the magnetic field is gradually increased from (−)HS, respective images captured at dots ①, ②, and ③ of FIG. 6 may be as shown in FIG. 7. A coercive force (e.g., a magnetic field of an image ② of FIG. 7) of each memory device 21 and a deviation thereof may be obtained from acquired images. When sizes of the memory devices 21 are less than a resolution of the camera 14, a magnetic property of each of the memory devices 21 may be obtained as an average magnetic property of an observation region.

When magnetic property measurement is performed using the magnetic property measurement apparatus 10, a time may be generally taken to change a magnetic field according to a characteristic of a magnet. In addition, a camera exposure time may be needed to be long to detect a weak signal. As a result, a considerably long time may be needed to measure a magnetic property using the magnetic property measurement apparatus 10. Additionally, when the whole surface of the wafer 20 is inspected, the measurement is typically repeated while moving the wafer 20, and thus, an inspection time may significantly increase.

In addition, a coercive force may be commonly measured by a magnetic hysteresis loop. For example, magnetization of a subject is measured while applying an external magnetic field to the subject and sweeping a strength of the external magnetic field. For example, as shown in FIG. 8, the measurement may be a cycle of measuring a (+)-side coercive force and a (−)-side coercive force. Accordingly, as shown in FIG. 9, both a time taken to measure the (+)-side coercive force and a time taken to measure the (−)-side coercive force are necessary, and thus, an inspection time may also increase.

However, as shown in FIG. 1, the magnetic property measurement apparatus 100 according to the present embodiment may generate a magnetic field, which is constant with time and which may vary with relative position, through the magnetic field generation unit 101 having two electromagnets (e.g., the first and second electromagnets 101-1 and 101-2) and measure a magnetic property of the subject 500 by using the TDI camera 105 in a scan manner by movement of the stage 103, thereby solving all the problems described above.

For example, in the magnetic property measurement apparatus 100 according to the present embodiment, a magnetic field varies according to places based on the two electromagnets, e.g., the first and second electromagnets 101-1 and 101-2, and thus, the magnetic field may be changed through movement of the subject 500, and accordingly, a time for changing a magnetic field may be unnecessary. In addition, by capturing images through the integration and exposure technique by using the TDI camera 105, even for a weak signal (e.g., a low intensity of light), images may be clearly captured with high sensitivity without a long exposure time. Furthermore, measurement of the subject 500 may be performed by moving the stage 103 through a positive (+) magnetic field, a zero magnetic field, and a negative (−) magnetic field, thereby remarkably reducing a measurement time.

Hereinafter, photographing by the TDI camera 105 will be described in more detail with reference to FIGS. 10 and 11.

Figure 10:
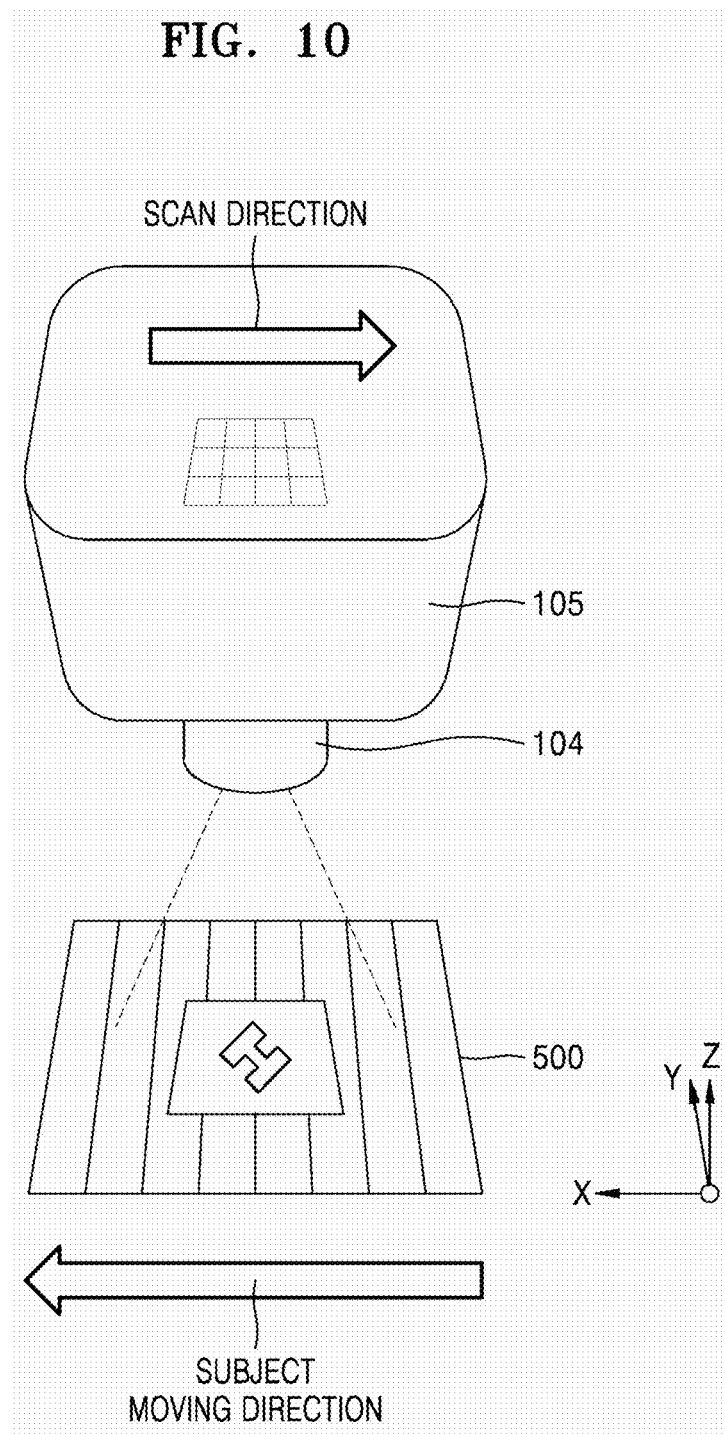
FIG. 10 is a conceptual diagram showing a relationship between a moving direction of a subject and a scan direction of a time delay integration (TDI) camera in a magnetic property measurement apparatus.
Figure 11:
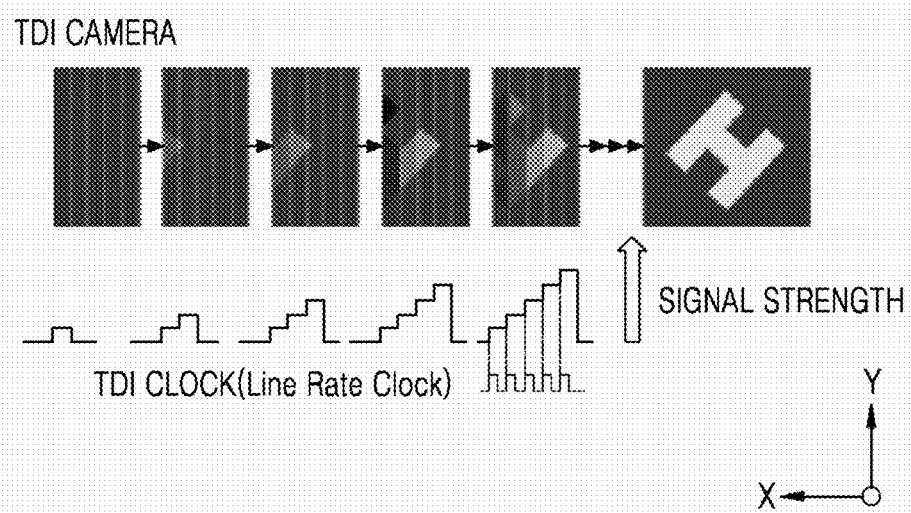
FIG. 11 illustrates photographs showing an example of scanning of the TDI camera in the magnetic property measurement apparatus of FIG. 1.

FIG. 10 is a conceptual diagram showing a relationship between a moving direction of the subject 500 and a scan direction of the TDI camera 105 in the magnetic property measurement apparatus 100 of FIG. 1, and FIG. 11 illustrates photographs showing an example of scanning of the TDI camera 105. The description made above with reference to FIGS. 1 to 9 will be simply repeated or omitted.

Referring to FIGS. 10 and 11, FIG. 10 shows an operation of photographing the moving subject 500 using the TDI camera 105. In FIG. 10, the moving direction of the subject 500 and the scan direction of the TDI camera 105 are indicated as arrows. For example, as shown in FIG. 10, the subject 500 may move in a left direction of the first direction (e.g., the X-direction). With respect to the moving direction of the subject 500, because the TDI camera 105 is fixed, an image scan direction may be a right direction of the first direction (the X-direction). In FIG. 10, the Kerr rotation angle detection optical system 104 is shown in a simple shape below the TDI camera 105, and the stage 103 and the surface plate 106 are omitted and not shown.

As shown in FIG. 11, the TDI camera 105 may capture images at every TDI clocks. The captured images may be superimposed by shifting a corresponding image by a subject moving distance in the first direction (the X-direction) for a time to a subsequent image capturing timing. By repeating such superimposition, a captured image of the subject 500 at the same location may be obtained. As a result, a plurality of image capturing results of the subject 500 may be integrated.

According to the magnetic property measurement apparatus 100 of FIG. 1, because a magnetic field to be applied to a memory device varies according to locations of the stage 103, magnetic fields generated by the first and second electromagnets 101-1 and 101-2 may be constant, and a current flowing through a coil does not have to be changed. Therefore, the magnetic property measurement apparatus 100 of FIG. 1 may perform high-speed measurement without a decrease in a measurement speed due to a response of the first and second electromagnets 101-1 and 101-2. In addition, in the magnetic property measurement apparatus 100 of FIG. 1, because a magnetization distribution of a memory device is monitored as an image, and integration is performed using the TDI camera 105, highly sensitive measurement may be performed, and long-time image capturing may be unnecessary. Particularly, because the subject 500 moves in a positionally constant magnetic field, the magnetic property of the subject 500 may be measured only by starting from the (+)HS magnetic field, passing through the zero magnetic field, and ending in the (−)HS magnetic field (and/or vice-versa).

According to the magnetic property measurement apparatus 100 of FIG. 1, because a change in polarization by reflective light of the subject 500 is picked up as an image, the magnetic property of the subject 500 may be measured as an image of the subject 500, and magnetic properties of a plurality of parts may be simultaneously measured. For example, according to the magnetic property measurement apparatus 100 of FIG. 1, the magnetic property of the subject 500 may be measured by irradiating light on the moving subject 500, continuously measuring a polarization angle of reflective light from the subject 500, and monitoring polarization angles according to locations. As described above, the TDI camera 105 may be used for these continuous measurements while moving. The TDI camera 105 may be synchronized with movement of a matter to capture images and integrate the captured images, thereby photographing a moving matter at a high speed with high sensitivity, and thus, the TDI camera 105 may be widely used for and/or in a semiconductor inspection device. As described above, the magnetic property measurement apparatus 100 of FIG. 1 may continuously photograph a moving subject 500 using the TDI camera 105, and accordingly, detect a minute polarization angle of reflective light with high sensitivity.

Figure 12:
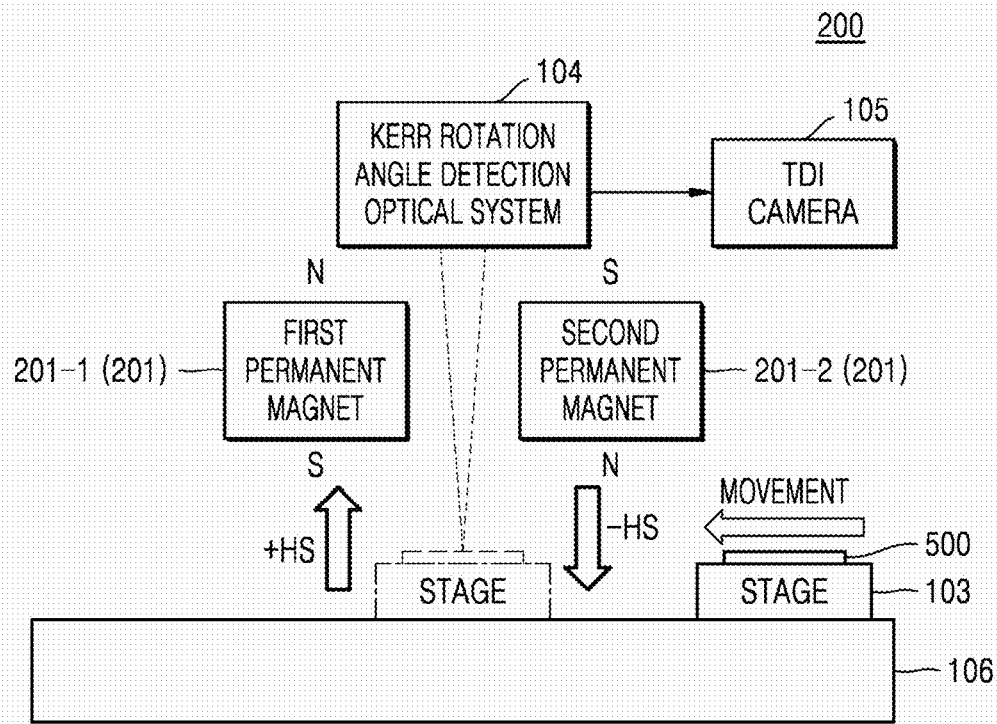
FIG. 12 is a conceptual diagram of a magnetic property measurement apparatus according to some embodiments.

FIG. 12 is a conceptual diagram of a magnetic property measurement apparatus 200 according to some embodiments. The description made above with reference to FIGS. 1 to 11 will be simply repeated or omitted.

Referring to FIG. 12, the magnetic property measurement apparatus 200 may differ from the magnetic property measurement apparatus 100 of FIG. 1 in the configuration of a magnetic field generation unit 201. For example, the magnetic property measurement apparatus 200 may include the magnetic field generation unit 201, the stage 103, the Kerr rotation angle detection optical system 104, the TDI camera 105, and the surface plate 106. The stage 103, the Kerr rotation angle detection optical system 104, the TDI camera 105, and the surface plate 106 are the same as described with respect to the magnetic property measurement apparatus 100 of FIG. 1.

The stage 103 may form the mobile unit, and the Kerr rotation angle detection optical system 104 and the TDI camera 105 may form the measurement unit. A detailed configuration and operation of the Kerr rotation angle detection optical system 104 are the same as described with reference to FIGS. 1 and 2. In addition, an operation and effect of the TDI camera 105 are the same as described with reference to FIGS. 10 and 11.

The magnetic field generation unit 201 may generate a magnetic field which is constant with time and varies with relative position. The magnetic field generation unit 201 may include a first permanent magnet 201-1 and a second permanent magnet 201-2. For example, the first permanent magnet 201-1 and the second permanent magnet 201-2 may generate a magnetic field which is constant with time.

In addition, the locations of the first permanent magnet 201-1 and the second permanent magnet 201-2 may be fixed. For example, the first permanent magnet 201-1 and the second permanent magnet 201-2 may be fixed to locations spaced by a certain distance from a space in which the stage 103 moves. For example, the first permanent magnet 201-1 and the second permanent magnet 201-2 may be fixed to locations spaced by a certain distance in the third direction (e.g., the Z-direction) from the upper surface of the surface plate 106 on which the stage 103 is disposed.

The first permanent magnet 201-1 and the second permanent magnet 201-2 may be separated from each other, and a space in which the Kerr rotation angle detection optical system 104 may measure the subject 500 may be formed between the first permanent magnet 201-1 and the second permanent magnet 201-2. For example, the first permanent magnet 201-1 and the second permanent magnet 201-2 may be disposed to be separated from each other in the first direction (e.g., the X-direction), and the Kerr rotation angle detection optical system 104 may measure the subject 500 through the space between the first permanent magnet 201-1 and the second permanent magnet 201-2.

The first permanent magnet 201-1 and the second permanent magnet 201-2 may generate constant magnetic fields in opposite directions. For example, as shown in FIG. 12, the first permanent magnet 201-1 may generate the magnetic field (+)HS in the upper direction (the positive Z-axis direction) of the third direction (the Z-direction). In addition, the second permanent magnet 201-2 may generate the magnetic field (−)HS in the lower direction (the negative Z-axis direction) of the third direction (the Z-direction). However, according to some embodiments, the first permanent magnet 201-1 and the second permanent magnet 201-2 may generate magnetic fields in opposite directions to those described above, respectively. For example, the first permanent magnet 201-1 may generate the magnetic field (−)HS in the lower direction (the negative Z-axis direction) of the third direction (the Z-direction), and the second permanent magnet 201-2 may generate the magnetic field (+)HS in the upper direction (the positive Z-axis direction) of the third direction (the Z-direction). By this combination of the first permanent magnet 201-1 and the second permanent magnet 201-2, the magnetic field generation unit 201 may generate a magnetic field which is constant with time and varies with relative position.

As such, in the magnetic property measurement apparatus 200 according to the present example embodiments, because a magnetic field generated by a permanent magnet is constant and does not vary with time, the magnetic field generation unit 201 may be configured using a permanent magnet (e.g., instead of an electromagnet). As a result, in the magnetic property measurement apparatus 200 according to the present embodiment, power for driving an electromagnet is unnecessary, and a high speed operation, power saving, and low costs may be achieved.

Figure 13:
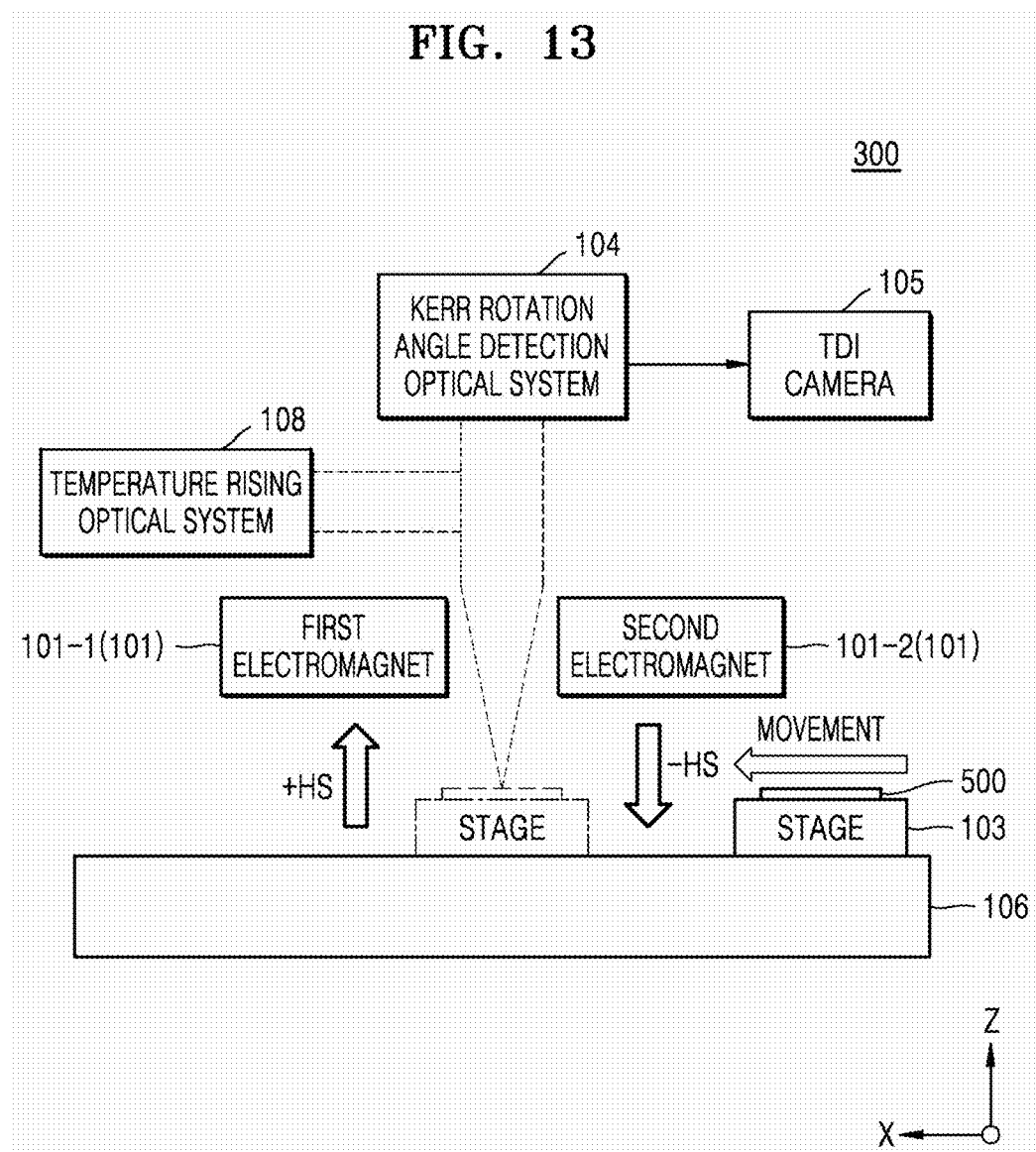
FIG. 13 is a conceptual diagram of a magnetic property measurement apparatus according to some embodiments.
Figure 14:
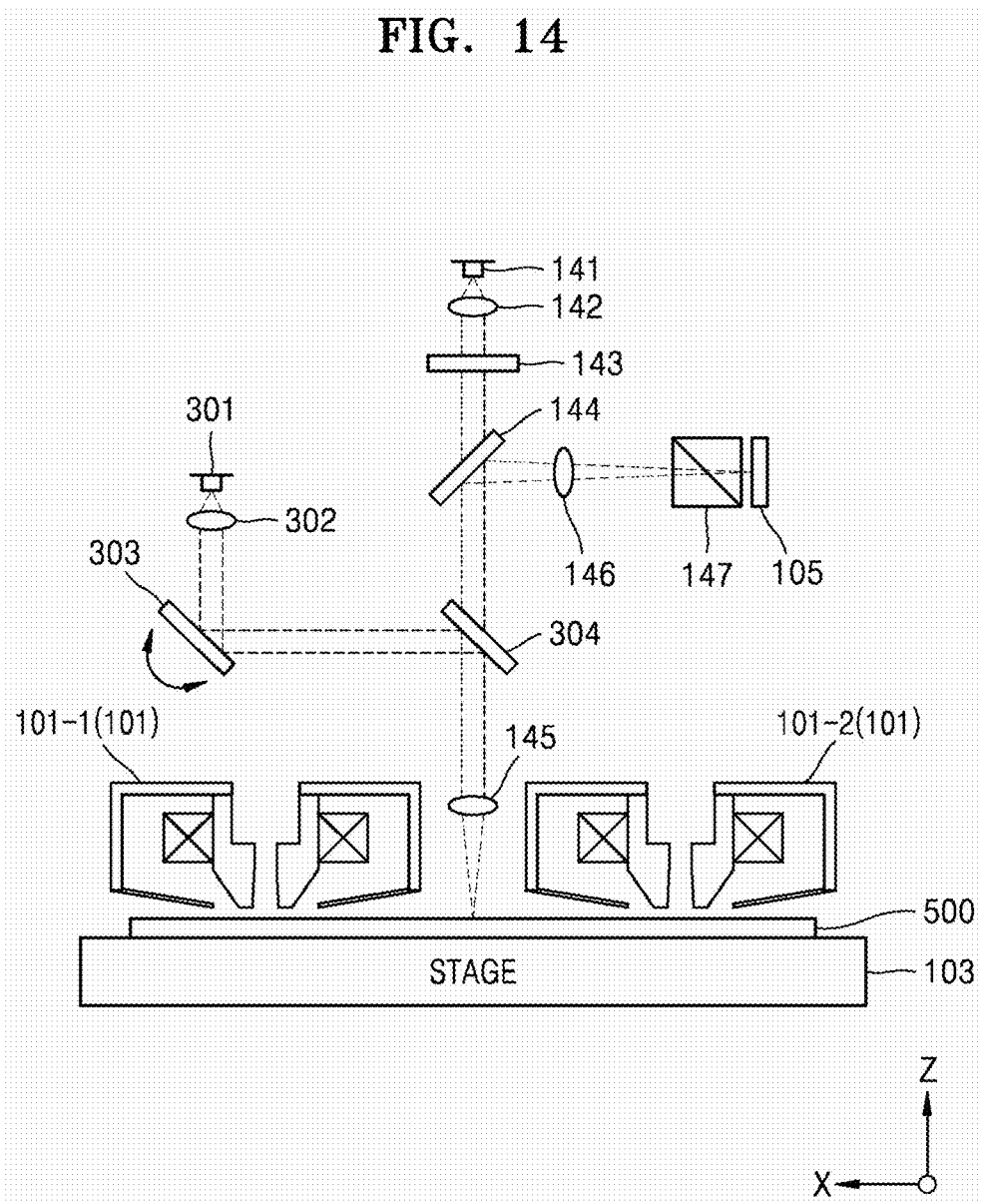
FIG. 14 is a conceptual diagram of a Kerr rotation angle detection optical system and a temperature rising optical system in the magnetic property measurement apparatus of FIG. 13.

FIG. 13 is a conceptual diagram of a magnetic property measurement apparatus 300 according to some example embodiments, and FIG. 14 is a conceptual diagram of the Kerr rotation angle detection optical system 104 and a temperature rising optical system 108 in the magnetic property measurement apparatus 300 of FIG. 13. The description made above with reference to FIGS. 1 to 12 will be simply repeated or omitted.

Referring to FIGS. 13 and 14, the magnetic property measurement apparatus 300 according to some embodiments may differ from the magnetic property measurement apparatus 100 of FIG. 1 in that the former (e.g., magnetic property measurement apparatus 300) further includes the temperature rising optical system 108 configured to raise a temperature of the subject 500. For example, the magnetic property measurement apparatus 300 according to the present embodiment may include the magnetic field generation unit 101, the stage 103, the Kerr rotation angle detection optical system 104, the TDI camera 105, the surface plate 106, and the temperature rising optical system 108.

The magnetic field generation unit 101, the stage 103, the Kerr rotation angle detection optical system 104, the TDI camera 105, and the surface plate 106 are the same as described with respect to the magnetic property measurement apparatus 100 of FIG. 1. For example, the magnetic field generation unit 101 may include the first electromagnet 101-1 and the second electromagnet 101-2 (and/or, though not illustrated, the magnetic field generation unit 201 of FIG. 12) and generate a magnetic field which is constant with time and varies with relative position. In addition, the stage 103 may form the mobile unit, and the Kerr rotation angle detection optical system 104 and the TDI camera 105 may form the measurement unit.

The Kerr rotation angle detection optical system 104 may include a light source (e.g., the detection laser unit 141), the first lens 142, the polarization element 143, the first beam splitter 144, the second lens 145, the third lens 146, and the polarization beam splitter 147. The detection laser unit 141 may generate and emit laser light for measuring a Kerr effect. The first lens 142 may be a collimator lens which refracts the laser light from the detection laser unit 141 to parallel light. The polarization element 143 may transmit only a certain polarization component from among the laser light from the detection laser unit 141. The first beam splitter 144 may transmit (e.g., through refraction, reflection, and/or conveyance through) the laser light from the detection laser unit 141 so that the laser light moves toward a second beam splitter 304. In addition, the first beam splitter 144 may transmit the reflective light reflected from the second beam splitter 304 (e.g., the light of which polarization has been changed on the subject 500 by the Kerr effect) so that the light reflected from the second beam splitter 304 moves toward the TDI camera 105. The second lens 145 may be an objective lens which concentrates the laser light from the detection laser unit 141 to the subject 500. The third lens 146 may be an imaging lens which focuses on an image pickup surface of the TDI camera 105. The polarization beam splitter 147 may be an optical element configured to split incident light into S-polarized light (or vertically polarized light) and P-polarized light (or horizontally polarized light).

The temperature rising optical system 108 may include a temperature rising light source (e.g., laser unit 301), a fourth lens 302, a rocking mirror 303, and the second beam splitter 304.

The light source (e.g., the temperature rising laser unit 301) may generate and emit light (e.g., laser light) to be irradiated on the subject 500. For example, the temperature rising laser unit 301 may generate and emit laser light of an infrared wavelength. However, a wavelength of the light of the temperature rising laser unit 301 is not limited to the infrared wavelength. For example, any type of light source of a wavelength by which a temperature of the subject 500 is raised may be applied to the temperature rising laser unit 301.

The fourth lens 302 may be a collimator lens which refracts the laser light from the temperature rising laser unit 301 to parallel light. For example, the fourth lens 302 may refract the laser light from the temperature rising laser unit 301 to parallel light and output the parallel light.

The rocking mirror 303 may be a mirror element which reflects the laser light from the temperature rising laser unit 301 to a random (and/or otherwise determined) direction.

For example, the rocking mirror 303 may include a Galvano mirror. However, the rocking mirror 303 is not limited to the Galvano mirror.

For example, the rocking mirror 303 may deflect light flux of laser light so that the laser light follows the stage 103 which is moving. In some embodiments, by controlling the rocking mirror 303 by a controller (not shown), a direction of laser light reflected from the rocking mirror 303 may be adjusted, and the laser light may follow the stage 103 which is moving. As such, along with the movement of the subject 500 on the stage 103, the controller may change the direction of the laser light reflected from the rocking mirror 303 so that a part of the subject 500 on which the laser light is irradiated is constantly maintained without being changed even while moving the subject 500. Accordingly, in the magnetic property measurement apparatus 300 even when the subject 500 (e.g., a wafer) on the stage 103 moves, the laser light of the temperature rising laser unit 301 may always keep raising a temperature of the same point on the wafer.

The second beam splitter 304 may transmit (e.g., through refraction, reflection, and/or conveyance through) the light from the light source (e.g., temperature rising laser unit 301) so that the light moves toward the subject 500. In addition, the second beam splitter 304 may transmit the laser light from the detection laser unit 141 so that the laser light moves toward the subject 500. In addition, the second beam splitter 304 may reflect or transmit (e.g., through refraction, reflection, and/or conveyance through) reflective light of which polarization has been changed on the subject 500 by the Kerr effect so that the reflective light moves toward the TDI camera 105. As shown in FIG. 14, the reflective light of the subject 500 may be incident to the TDI camera 105 by passing through the second lens 145, the second beam splitter 304, the first beam splitter 144, the third lens 146, and the polarization beam splitter 147.

In addition, laser light incident from the temperature rising laser unit 301 to the subject 500 by passing through the second beam splitter 304 may be concentrated through the second lens 145 and irradiated on the subject 500. As described above, the second lens 145 may be an objective lens which concentrates light. Therefore, in the magnetic property measurement apparatus 300, according to some example embodiments, the Kerr rotation angle detection optical system 104 and the temperature rising optical system 108 may share the second beam splitter 304 and the second lens 145.

Thereby the magnetic property measurement apparatus 300 may include the temperature rising optical system 108 configured to raise a temperature of the subject 500 by irradiating laser light on the subject 500, and thereby measuring a temperature dependent magnetic property of the subject 500 according to a temperature change of the subject 500. In addition, in the magnetic property measurement apparatus 300 according to the present embodiment, the temperature rising optical system 108 may raise a temperature of only a portion of the subject 500 for which measurement of a magnetic property is necessary, by irradiating laser light of the temperature rising laser unit 301 only on the portion of the subject 500.

Furthermore, in the magnetic property measurement apparatus 300, because the temperature rising optical system 108 includes the rocking mirror 303 which deflects light flux of laser light of the temperature rising laser unit 301, and the rocking mirror 303 has a deflection direction synchronized with movement of the stage 103, even when the subject 500 moves by the stage 103, the laser light of the temperature rising laser unit 301 may always keep raising a temperature of the same point on the subject 500 (e.g., a wafer).

In the magnetic property measurement apparatus 300, the temperature rising laser unit 301 in the temperature rising optical system 108 may previously calibrate light intensity of the light with respect to a temperature to maintain a temperature of the subject 500 to be constant substantially at a set temperature, thereby measuring a magnetic property of the subject 500 at the set temperature. In addition, in the magnetic property measurement apparatus 300, the light intensities of the light may be previously calibrated with respect to a plurality of set temperatures, and accordingly, a temperature of the subject 500 may be raised to each of the plurality of set temperatures. As a result, the magnetic property measurement apparatus 300 according to the present embodiment may measure a magnetic property of the subject 500 at each of the plurality of set temperatures. Herein, the plurality of set temperatures may be random and/or otherwise determined.

In the magnetic property measurement apparatus 300 according to the present embodiment, the subject 500 may be a semiconductor. Accordingly, the magnetic property measurement apparatus 300 according to the present embodiment may measure a magnetic property of the semiconductor and inspect quality of the semiconductor. For example, to be used as a practical magnetic random access memory (MRAM) device, it may be necessary that a characteristic of the MRAM device is not degraded under a high-temperature environment. In addition, in production of an MRAM device, there is a process in a high-temperature state, and also to mount the MRAM device, the MRAM device needs to undergo a soldering temperature. Therefore, to measure a magnetic property of an MRAM device, measurement under a high-temperature environment may be significant.

The magnetic property measurement apparatus 300 according to the present embodiment may include the temperature rising optical system 108 to irradiate laser light of the temperature rising laser unit 301 on all over or a portion of an observation region of the subject 500, thereby raising a temperature of all over or the portion of the observation region, and thus, a magnetic property of the subject 500 (e.g., an MRAM device) may be measured under a high-temperature environment. In addition, when a temperature of only a portion of the observation region of the subject 500 is raised, the magnetic property measurement apparatus 300 according to the present embodiment may easily detect a change in a magnetic property of the subject 500, e.g., an MRAM device, due to a temperature by one-time photographing.

Though not illustrated, the magnetic property measurement apparatuses 100, 200, and 300 of FIGS. 1, 12, and 13 may include a controller configured to control the operation of the magnetic property measurement apparatuses 100, 200, and 300. The controller may include processing circuitry such as hardware including logic circuits; a hardware/software combination such as a processor executing software; or a combination thereof. For example, the processing circuity more specifically may include, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), etc. The controller may, in some embodiments, control the operation of the Kerr rotation angle detection optical system 104, the magnetic field generation unit 101, the TDI camera 105, the temperature rising optical system 108, and/or the movement of the stage 103.

The technical ideas of the inventive concepts are not limited to the aspects of the example embodiments described above. For example, the embodiments may be variously modified within a scope without departing from the technical idea of the inventive concepts. For example, in the magnetic property measurement apparatuses 100 and 300 of FIGS. 1 and 13, the first and second electromagnets 101-1 and 101-2 in the magnetic field generation unit 101 may be disposed at any locations on an x-y plane so long as the locations are locations through which the subject 500 moves in a magnetic field. Herein, the x-y plane is parallel to the upper surface of the surface plate 106 and may be spaced by a certain distance from the upper surface of the surface plate 106 in the third direction (the Z-direction). In addition, in the magnetic property measurement apparatus 200 of FIG. 12, the first and second permanent magnets 201-1 and 201-2 in the magnetic field generation unit 201 may also be disposed at any locations on the x-y plane only if the locations are locations through which the subject 500 moves in a magnetic field.

Furthermore, in the magnetic property measurement apparatuses 100, 200, and 300 of FIGS. 1, 12, and 13, the light source (e.g., the detection laser unit 141) may use various light-emitting elements, besides a laser, as a light source for measuring a Kerr effect. For example, the light source may include various light-emitting elements, such as a light-emitting diode. Additionally, like the magnetic property measurement apparatus 200 of FIG. 12, the magnetic property measurement apparatus 300 of FIG. 13 may include a magnetic field generation unit 201 using the first and second permanent magnets 201-1 and 201-2 instead of the first and second electromagnets 101-1 and 101-2. For example, the magnetic property measurement apparatus 300 of FIG. 13 may include the magnetic field generation unit 201, the stage 103, the Kerr rotation angle detection optical system 104, the TDI camera 105, the surface plate 106, and the temperature rising optical system 108, and the magnetic field generation unit 201 may include the first and second permanent magnets 201-1 and 201-2.

While the inventive concepts have been particularly shown and described with reference to some embodiments thereof, it will be understood that various changes in form and details may be made therein without departing from the spirit and scope of the following claims.

What is claimed is:

1. A magnetic property measurement apparatus comprising:
    a magnetic field generation unit configured to generate a magnetic field which is constant with time and varies with relative position;
    a mobile unit configured to move a subject to be measured in the magnetic field;
    a measurement unit configured to measure a magnetic property of the subject moving in the magnetic field; and
    processing circuitry configured to control the relative position of the mobile unit in the magnetic field during the measuring of the magnetic property.

2. The magnetic property measurement apparatus of claim 1, wherein the measurement unit comprises:
    a Kerr rotation angle detection optical system configured to irradiate polarized laser light on the subject and to separate a polarization component of reflective light reflected from the subject; and
    an image detection unit configured to pick up polarization of the reflective light, and detect the magnetic property as an image.

3. The magnetic property measurement apparatus of claim 2, wherein the Kerr rotation angle detection optical system comprises:
    a detection laser unit configured to generate and irradiate laser light;
    a polarization element configured to polarize the laser light; and
    a polarization beam splitter configured to separate the polarization component of the reflective light.

4. The magnetic property measurement apparatus of claim 2, wherein
    the image detection unit comprises a time delay integration (TDI) camera, and
    the TDI camera is synchronized with a movement of the mobile unit.

5. The magnetic property measurement apparatus of claim 1, further comprising:
    a temperature rising optical system configured to raise a temperature of the subject by irradiating light on the subject.

6. The magnetic property measurement apparatus of claim 5, wherein the temperature rising optical system comprises:
    a temperature rising laser unit configured to generate the light and irradiate the light on the subject; and
    a rocking mirror deflecting a light flux of the light,
    wherein the rocking mirror synchronizes a deflecting direction of the light flux with a movement of the mobile unit.

7. The magnetic property measurement apparatus of claim 5, wherein the temperature rising optical system is further configured to calibrate light intensity of the irradiated light with respect to a temperature and to maintain a temperature of the subject to be substantially constant.

8. The magnetic property measurement apparatus of claim 1, wherein
    the magnetic field generation unit is configured to be spaced upward from an upper surface of the subject, and
    the magnetic field generation unit comprises a first electromagnet and second electromagnet configured to be spaced apart from each other in a direction parallel to the upper surface of the subject.

9. The magnetic property measurement apparatus of claim 8, wherein
    the first electromagnet is configured to generate a positive (+) magnetic field oriented from the subject to the first electromagnet,
    the second electromagnet is configured to generate a negative (−) magnetic field oriented from the second electromagnet to the subject, and
    the magnetic property of the subject is measured by, according to a movement of the mobile unit, starting from the positive (+) magnetic field, passing through a zero magnetic field, and ending in the negative (−) magnetic field.

10. The magnetic property measurement apparatus of claim 8, wherein
    the measurement unit comprises a Kerr rotation angle detection optical system and an image detection unit, and
    the Kerr rotation angle detection optical system is configured to measure the magnetic property of the subject through a space between the first electromagnet and the second electromagnet.

11. The magnetic property measurement apparatus of claim 1, wherein
the magnetic field generation unit is configured to be spaced upward from an upper surface of the subject, and
the magnetic field generation unit comprises a first permanent magnet and a second permanent magnet configured to be spaced apart from each other in a direction parallel to the upper surface of the subject.

12. A magnetic property measurement apparatus comprising:
a mobile unit configured to move a subject in a magnetic field;
a magnetic field generation unit spaced upward from an upper surface of the subject, and configured to generate the magnetic field which is constant with time and varies with relative position;
a Kerr rotation angle detection optical system configured to irradiate polarized first light on the subject and to separate a polarization component of reflective light reflected from the subject;
a time delay integration (TDI) camera configured to pick up polarization of the reflective light by synchronizing with a movement of the subject and to detect a magnetic property of the subject as an image; and
processing circuitry configured to control the relative position of the mobile unit in the magnetic field during the detecting of the magnetic property.

13. The magnetic property measurement apparatus of claim 12, wherein the Kerr rotation angle detection optical system comprises:
a detection laser unit configured to generate and irradiate the first light;
a polarization element configured to polarize the first light; and
a polarization beam splitter configured to separate the polarization component of the reflective light.

14. The magnetic property measurement apparatus of claim 12, further comprising:
a temperature rising optical system configured to raise a temperature of the subject by irradiating second light on the subject.

15. The magnetic property measurement apparatus of claim 14, wherein the temperature rising optical system comprises:
a temperature rising laser unit configured to generate the second light and irradiate the second light on the subject; and
a rocking mirror deflecting a light flux of the second light, wherein the rocking mirror synchronizes a deflecting direction of the light flux with the movement of the subject.

16. The magnetic property measurement apparatus of claim 14, wherein the temperature rising optical system is further configured to calibrate an intensity of the second light with respect to a temperature and to maintain a temperature of the subject to be substantially constant.

17. The magnetic property measurement apparatus of claim 12, wherein the magnetic field generation unit comprises at least one of
a first electromagnet and a second electromagnet spaced apart from each other in a direction parallel to the upper surface of the subject, or
a first permanent magnet and a second permanent magnet spaced apart from each other in the direction parallel to the upper surface of the subject.

18. A magnetic property measurement apparatus comprising:
a mobile unit configured to move a subject on a surface plate in a magnetic field;
a magnetic field generation unit spaced upward from an upper surface of the subject, and configured to generate the magnetic field which is constant with time and varies with relative position by using two electromagnets or two permanent magnets;
a Kerr rotation angle detection optical system configured to irradiate polarized first laser light on the subject and to separate a polarization component of reflective light reflected from the subject; and
a time delay integration (TDI) camera configured to pick up polarization of the reflective light by synchronizing with a movement of the mobile unit, and to detect a magnetic property of the subject as an image,
wherein a first magnet from among the two electromagnets or the two permanent magnets generates a positive (+) magnetic field oriented from the subject to the first magnet,
a second magnet from among the two electromagnets or the two permanent magnets generates a negative (−) magnetic field oriented from the second magnet, and
the magnetic property of the subject is measured by, according to the movement of the mobile unit, starting from the positive (+) magnetic field, passing through a zero magnetic field, and ending in the negative (−) magnetic field.

19. The magnetic property measurement apparatus of claim 18, further comprising:
a temperature rising optical system configured to raise a temperature of the subject by irradiating a second light on the subject.

20. The magnetic property measurement apparatus of claim 19, wherein the temperature rising optical system comprises:
a temperature rising laser unit configured to generate the second light and irradiate the second light on the subject; and
a rocking mirror deflecting a light flux of the second light, wherein the rocking mirror is configured to synchronize a deflecting direction of the light flux with the movement of the mobile unit.

* * * * *